(12) United States Patent
Meric et al.

(10) Patent No.: US 8,735,209 B2
(45) Date of Patent: May 27, 2014

(54) GRAPHENE DEVICE INCLUDING A PVA LAYER OR FORMED USING A PVA LAYER

(71) Applicant: The Trustees of Columbia University in the City of New York, New York, NY (US)

(72) Inventors: Inanc Meric, New York, NY (US); Kenneth Shepard, Ossining, NY (US); Noah J. Tremblay, New York, NY (US); Philip Kim, New York, NY (US); Colin P. Nuckolls, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 13/838,001

(22) Filed: Mar. 15, 2013

(65) Prior Publication Data

US 2014/0099764 A1 Apr. 10, 2014

Related U.S. Application Data

(63) Continuation of application No. 12/839,095, filed on Jul. 19, 2010, now Pat. No. 8,445,893.

(60) Provisional application No. 61/271,465, filed on Jul. 21, 2009.

(51) Int. Cl.
*H01L 21/84* (2006.01)
(52) U.S. Cl.
USPC ......... 438/82; 438/85; 438/104; 257/E21.703

(58) Field of Classification Search
USPC ................. 438/82–89, 104; 257/E21.703
See application file for complete search history.

(56) References Cited

U.S. PATENT DOCUMENTS

| 4,551,195 | A | 11/1985 | Iizuka et al. | |
|---|---|---|---|---|
| 7,619,257 | B2 | 11/2009 | Pfeiffer | |
| 2007/0287011 | A1 | 12/2007 | DeHeer | |
| 2009/0169919 | A1 | 7/2009 | Garcia et al. | |
| 2009/0227755 | A1* | 9/2009 | Devoe et al. | 526/319 |
| 2010/0051907 | A1 | 3/2010 | Pfeiffer | |
| 2010/0102299 | A1* | 4/2010 | Murase et al. | 257/40 |
| 2010/0112773 | A1* | 5/2010 | Ting | 438/381 |

(Continued)

FOREIGN PATENT DOCUMENTS

WO WO-2012088334 A1 6/2012

OTHER PUBLICATIONS

"U.S. Appl. No. 12/839,095, Non Final Office Action mailed Aug. 6, 2012", 9 pgs.

(Continued)

*Primary Examiner* — Thanh Nguyen
(74) *Attorney, Agent, or Firm* — Schwegman, Lundberg & Woessner, P.A.

(57) ABSTRACT

An apparatus or method can include forming a graphene layer including a working surface, forming a polyvinyl alcohol (PVA) layer upon the working surface of the graphene layer, and forming a dielectric layer upon the PVA layer. In an example, the PVA layer can be activated and the dielectric layer can be deposited on an activated portion of the PVA layer. In an example, an electronic device can include such apparatus, such as included as a portion of graphene field-effect transistor (GFET), or one or more other devices.

20 Claims, 7 Drawing Sheets

(56) References Cited

U.S. PATENT DOCUMENTS

| | | | |
|---|---|---|---|
| 2010/0127269 A1* | 5/2010 | Daniel et al. | ............ 257/66 |
| 2010/0224851 A1 | 9/2010 | Colombo et al. | |
| 2010/0255984 A1 | 10/2010 | Sutter et al. | |
| 2011/0017979 A1 | 1/2011 | Meric et al. | |

OTHER PUBLICATIONS

"U.S. Appl. No. 12/839,095, Notice of Allowance mailed Dec. 26, 2012", 7 pgs.

"U.S. Appl. No. 12/839,095, Response filed Jun. 25, 2012 to Restriction Requirement mailed Apr. 26, 2012".

"U.S. Appl. No. 12/839,095, Response filed Dec. 6, 2012 to Non-Final Office Action mailed Aug. 6, 2012", 8 pgs.

"U.S. Appl. No. 12/839,095, Restriction Requirement mailed Apr. 26, 2012", 5 pgs.

"Internation Application Serial No. PCT/US2011/066620, Search Report mailed May 21, 2012", 2 pgs.

"Internation Application Serial No. PCT/US2011/066620, Written Opinion mailed May 21, 2012", 6 pgs.

Blake, et al., "Graphene-Based Liquid Crystal Device", vol. 8, No. 6, (2008), 1704-1708.

Chandrasekhar, Venkat, et al., "Thermoelectric Applications of Carbon-Based Nanomaterials", [Online]. Retrieved from the Internet:<:http://isen.northwestern.edu/doc/pdf/Booster_VChandrasekhar.Mar10_Final.NarrativeReport.pdf>, (Mar. 2010), 3 pgs.

Chen, J. H, et al., "Intrinsic and extrinsic performance limits of graphene devices on SiO2.", Nat Nanotechnol., 3(4), (Apr. 2008), 206-9.

Dean, C. R, et al., "Boron Nitride Substrates for High-Quality Graphene Electronics", [Online]. Retrieved from the Internet:<:http://hone.mech.columbia.edu/pdf/cory_nnano_2010.pdf>, (Aug. 22, 2010), 7 pgs.

Jin, S. H, et al., "Pentacene OTFTs with PVA Gate Insulators on a Flexible Substrate", J. Korean Phys.Soc., 44, (Jan. 2004), 181-184.

Kim, S., et al., "Realization of a high mobility dual-gated graphene field-effect transistor with Al2O3 dielectric", Appl. Phys. Lett., 94, (2009), 062107(1-3).

Meric, I., et al., "Current saturation in zero-bandgap, top-gated graphene field-effect transistors.", Nat Nanotechnol., 3(11), (Nov. 2008), 654-9.

Ozyilmaz, B., et al., "Electronic Transport and Quantum Hall Effect in Bipolar Graphene p-n-p. Junctions", Phys. Rev. Lett. 99(16), (2007), 166804(1-4).

Shi, Yumeng, et al., "Synthesis of few-Layer Hexagonal Boron Nitride Thin Film by Chemical Vapor Deposition", 2010 American Chemical Society, [Online]. Retrieved from the Internet:<:http://idv.sinica.edu.tw/lanceli/Paper%20PDF/Synthesis%20of%20Few-Layer%20Hexagonal%20Boron%Nitride%20Thin%20Film%20-Chemical%20Vapor%20Deposition.pdf>, (Sep. 2, 2010), 4134-4139.

Wang, X., et al., "Atomic layer deposition of metal oxides on pristine and functionalized graphene.", J Am Chem Soc., 130(26), (Jul. 2, 2008), 8152-3.

Williams, J. R., et al., "Quantum Hall effect in a gate-controlled p-n junction of graphene", Science, 317(5838), (Aug. 3, 2007), 638-41.

\* cited by examiner

GRAPHENE DEVICE INCLUDING A PVA LAYER OR FORMED USING A PVA LAYER

CLAIM OF PRIORITY

This patent application is a continuation of U.S. patent application Ser. No. 12/839,095, titled "High-Performance Gate Oxides such as for Graphene Field-Effect Transistors or Carbon Nanotubes", filed Jul. 19, 2010, which claims the benefit of priority, under 35 U.S.C. Section 119(e), to Meric et al., U.S. Provisional Patent Application Ser. No. 61/271,465, titled "High-Performance Gate Oxides such as for Graphene Field-Effect Transistors or Carbon Nanotubes," filed on Jul. 21, 2009, the benefit of priority of each of which is hereby presently claimed, and each of which is hereby incorporated by reference herein in its entirety.

STATEMENT REGARDING FEDERALLY-SPONSORED RESEARCH OR DEVELOPMENT

This invention was made with government support under award number 523522 from the Defense Advanced Research Projects Agency (DARPA). The government has certain rights in this invention.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the drawings and photographs that form a part of this document: Copyright 2010, The Trustees of Columbia University in the City of New York, All Rights Reserved.

BACKGROUND

Graphene can be described as a two-dimensional sheet of covalently-bonded carbon atoms. For example, three-dimensional graphite can include sheets of graphene, and a one-dimension carbon nanotube can include a graphene wall (e.g., forming a single-wall carbon nanotube). An obstacle to development of a graphene-based electronic device, such as a graphene field-effect transistor (GFET), can be the inert nature of the covalently-bonded hexagonal carbon lattice of graphene.

SUMMARY

Graphene's inert nature can inhibit deposition or bonding of certain dielectric materials onto graphene. Such dielectric materials can otherwise be suitable for use as a gate dielectric in a graphene field-effect transistor (GFET). The present inventors have recognized, among other things, that a functionalization approach can enable the deposition of a high-$\kappa$ dielectric layer upon graphene, where $\kappa$ can represent a relative dielectric constant. Such a functionalization approach can also reduce or eliminate doping effects on the graphene. For example, the present inventors have recognized, among other things, that graphene can be chemically functionalized with polyvinyl alcohol (PVA) before a deposition of an oxide layer. In an example, the oxide deposition can include an atomic layer deposition (ALD) technique, and the deposited oxide layer can include a relatively thin, relatively high-$\kappa$ dielectric material, such as hafnium oxide.

In one approach, deposition of an oxide on graphene using ALD can involve an initial deposition of a noncovalent functionalization layer, including $NO_2$, such as used at the initial stage of ALD growth. In another approach, one or more thin layers of Al can be thermally evaporated, and allowed to subsequently oxidize. But, the present inventors have recognized that such noncovalent functionalization or evaporative techniques can have limitations, such as resulting in significant mobility degradation within the graphene, strong doping of the graphene channel, or resulting in non-uniform dielectric coverage (e.g, precluding forming a pinhole-free thin-layer dielectric film). The present inventors have recognized, among other things, that the chemical functionalization approach, such as using PVA, can avoid at least some of the issues associated with the noncovalent or evaporative approaches.

In an example, an apparatus or method can include forming a graphene layer including a working surface, forming a polyvinyl alcohol (PVA) layer upon the working surface of the graphene layer, and forming a dielectric layer upon the PVA layer. In an example, the PVA layer can be activated and the dielectric layer can be deposited on an activated portion of the PVA layer.

Example 1 includes subject matter (such as an apparatus) comprising an electronic device. The electronic device comprises a graphene layer including a working surface, a polyvinyl alcohol (PVA) layer formed upon the working surface of the graphene layer, and a dielectric layer formed upon the PVA layer.

In Example 2, the subject matter of Example 1 can optionally include a PVA layer comprising a portion activated for deposition of the dielectric layer upon the PVA layer.

In Example 3, the subject matter of one or any combination of Examples 1-2 can optionally include a dielectric layer comprising hafnium oxide.

In Example 4, the subject matter of one or any combination of Examples 1-3 can optionally include a silicon substrate, the graphene layer located upon an oxide layer included as a portion of the silicon substrate.

In Example 5, the subject matter of one or any combination of Examples 1-4 can optionally include a first electrode and a second electrode, both located upon, and conductively coupled to, the working surface of the graphene layer.

In Example 6, the subject matter of one or any combination of Examples 1-5 can optionally include first and second electrodes laterally separated along the working surface of the graphene layer, at least a portion of the PVA layer located upon the working surface of the graphene layer between the first and second electrodes, and the dielectric layer formed upon the first and second electrodes and formed laterally between the first and second electrodes upon the portion of the PVA layer located between the first and second electrodes.

In Example 7, the subject matter of one or any combination of Examples 1-6 can optionally include a third electrode formed upon the dielectric layer in a lateral region between the first and second electrodes.

In Example 8, the subject matter of one or any combination of Examples 1-7 can optionally include a silicon substrate, the graphene layer located upon an oxide layer included as a portion of the silicon substrate, the silicon substrate comprising a fourth electrode.

In Example 9, the subject matter of one or any combination of Examples 1-8 can optionally include a field effect transistor including at least a portion of the graphene layer, at least a portion of the PVA layer, at least a portion of the oxide layer, and at least a portion of the respective first, second, third, and fourth electrodes, the first and second electrodes configured as a respective source electrode and a respective drain electrode, the third electrode configured as a top-gate electrode, the fourth electrode is configured as a back-gate electrode, and comprising a channel length of the transistor determined at least in part by a lateral width of the third electrode between the first and second electrodes.

Example 10 can include, or can optionally be combined with the subject matter of one or any combination of Examples 1-9 to include, subject matter (such as a method, a means for performing acts, or a machine-readable medium including instructions that, when performed by the machine, cause the machine to perform acts) comprising forming a graphene layer including a working surface, forming a polyvinyl alcohol (PVA) layer upon the working surface of the graphene layer, and forming a dielectric layer upon the PVA layer.

In Example 11, the subject matter of Example 10 can optionally include forming the dielectric layer upon the PVA layer, including activating at least a portion of the PVA layer and depositing the dielectric layer upon the activated portion of the PVA layer.

In Example 12, the subject matter of one or any combination of Examples 10-11 can optionally include activating the PVA layer, including exposing at least a portion of the PVA layer to a combination of ultraviolet light and ozone.

In Example 13, the subject matter of one or any combination of Examples 10-12 can optionally include forming the dielectric layer, including depositing a hafnium oxide layer.

In Example 14, the subject matter of one or any combination of Examples 10-13 can optionally include forming the graphene layer, including transferring the graphene layer onto an oxide layer included as a portion of a silicon substrate.

In Example 15, the subject matter of one or any combination of Examples 10-14 can optionally include forming a first electrode and a second electrode, both located upon, and conductively coupled to, the working surface of the graphene layer.

In Example 16, the subject matter of one or any combination of Examples 10-15 can optionally include forming the first and second electrodes, including forming the electrodes laterally separated along the working surface of the graphene layer, the forming the PVA layer including forming at least a portion of the PVA layer upon the working surface of the graphene layer between the first and second electrodes, the forming the dielectric layer including forming the dielectric layer upon the first and second electrodes and laterally between the first and second electrodes upon the portion of the PVA layer located between the first and second electrodes.

In Example 17, the subject matter of one or any combination of Examples 10-16 can optionally include forming a third electrode upon the dielectric layer in a lateral region between the first and second electrodes.

In Example 18, the subject matter of one or any combination of Examples 10-17 can optionally include forming the graphene layer upon an oxide layer included as a portion of a silicon substrate, the silicon substrate configured as a fourth electrode.

In Example 19, the subject matter of one or any combination of Examples 10-18 can optionally include forming an electronic device configured to operate as a field effect transistor, the electronic device including at least a portion of the graphene layer, at least a portion of the PVA layer, at least a portion of the oxide layer, and at least a portion of the respective first, second, third, and fourth electrodes, the first and second electrodes configured as a respective source electrode and a respective drain electrode, the third electrode configured as a top-gate electrode, the fourth electrode configured as a back-gate electrode, and including a channel length of the transistor determined at least in part by a lateral width of the third electrode between the first and second electrodes.

Example 20 can include, or can optionally be combined with the subject matter of one or any combination of Examples 1-19 to include, subject matter (such as a method, a means for performing acts, or a machine-readable medium including instructions that, when performed by the machine, cause the machine to perform acts) comprising forming a graphene layer including a working surface, forming a polyvinyl alcohol (PVA) layer upon the working surface of the graphene layer, forming a dielectric layer upon the PVA layer, including activating at least a portion of the PVA layer and depositing the dielectric layer upon the activated portion of the PVA layer.

These examples can be combined in any permutation or combination. This overview is intended to provide an overview of subject matter of the present patent application. It is not intended to provide an exclusive or exhaustive explanation of the invention. The detailed description is included to provide further information about the present patent application.

Figure 1:
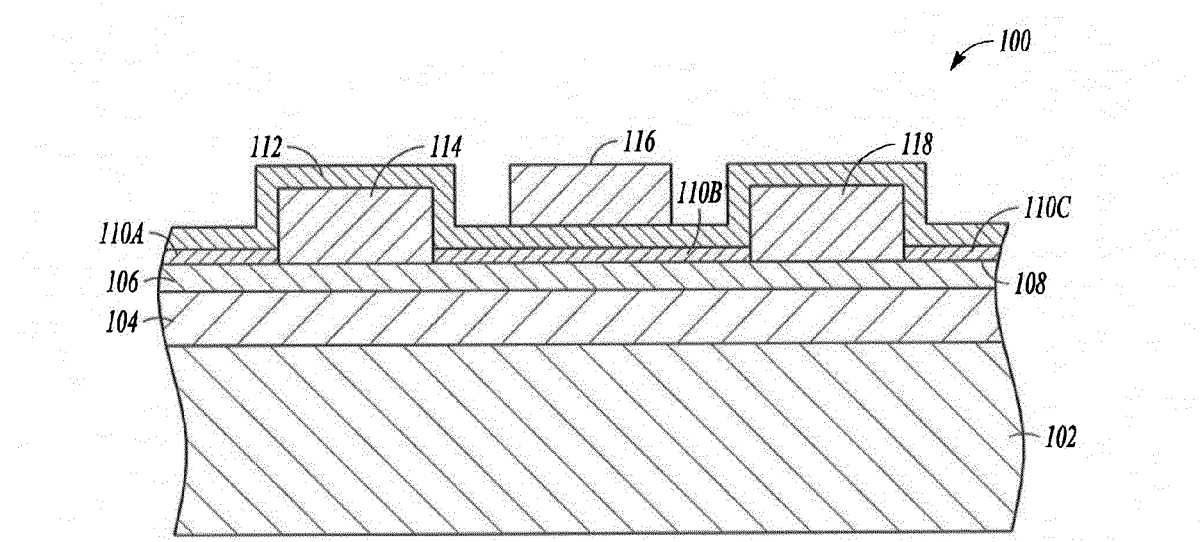
FIG. 1 illustrates generally a section view of an apparatus that can include an electronic device having a graphene layer, a polyvinyl alcohol (PVA) layer, and a dielectric layer.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

The patent or application file contains at least one drawing executed in color. Copies of this patent or patent application publication with color drawing(s) will be provided by the Office upon request and payment of the necessary fee.

DETAILED DESCRIPTION

FIG. 1 illustrates generally a section view of an apparatus 100 that can include an electronic device having a graphene layer 106, a polyvinyl alcohol (PVA) layer 110A-C, and a dielectric layer 112. In the example of FIG. 1, the graphene layer can include a working surface 108, and the PVA layer 110A-C can be bonded with or otherwise formed upon the graphene layer 106, such as on the working surface 108. In an example, the PVA layer can be activated, such as by exposure to ultraviolet light or ozone. In the example of FIG. 1, the dielectric layer 112 can be deposited or otherwise formed on one or more activated portions of the PVA layer 110A-C, or elsewhere.

In an example, one or more electrodes can be lithographically fabricated or otherwise formed as a portion of the apparatus 100. For example, in FIG. 1, a first electrode 114 and a second electrode 118 can be located on the working surface 108 of the graphene layer 106, such as spaced apart laterally along the working surface 108. In the example of FIG. 1, the graphene layer 106 can be transferred to or otherwise affixed or grown on an oxide layer 104. For example, such an oxide layer 104 can include silicon dioxide such as can be epitaxially grown on a silicon substrate 102, or including one or more other oxide or semiconductor materials.

In an example, such as after deposition of the dielectric layer 112, a third electrode 116 can be located in a lateral region between the first electrode 114 and the second electrode 118, such as located above the dielectric layer 112.

In an example, the apparatus 100 can be configured as a field-effect transistor (FET) device, such as using the first electrode 114 as a source (or drain) electrode, using the second electrode 118 as a corresponding drain (or source) electrode, and using one or more of the silicon substrate 102 or the third electrode 116 as a gate electrode. For example, the substrate 102 can be a fourth electrode or "back gate," and the third electrode 116 can be a "top gate." In an example, the third electrode 116 can be omitted, and the substrate 102 can be used to control the conduction state of the apparatus 102. The example of FIG. 1 can be fabricated such as using one or more processing techniques or structures as discussed below in the examples of FIGS. 2-8, 9A-B, and 10-11.

Figure 2:
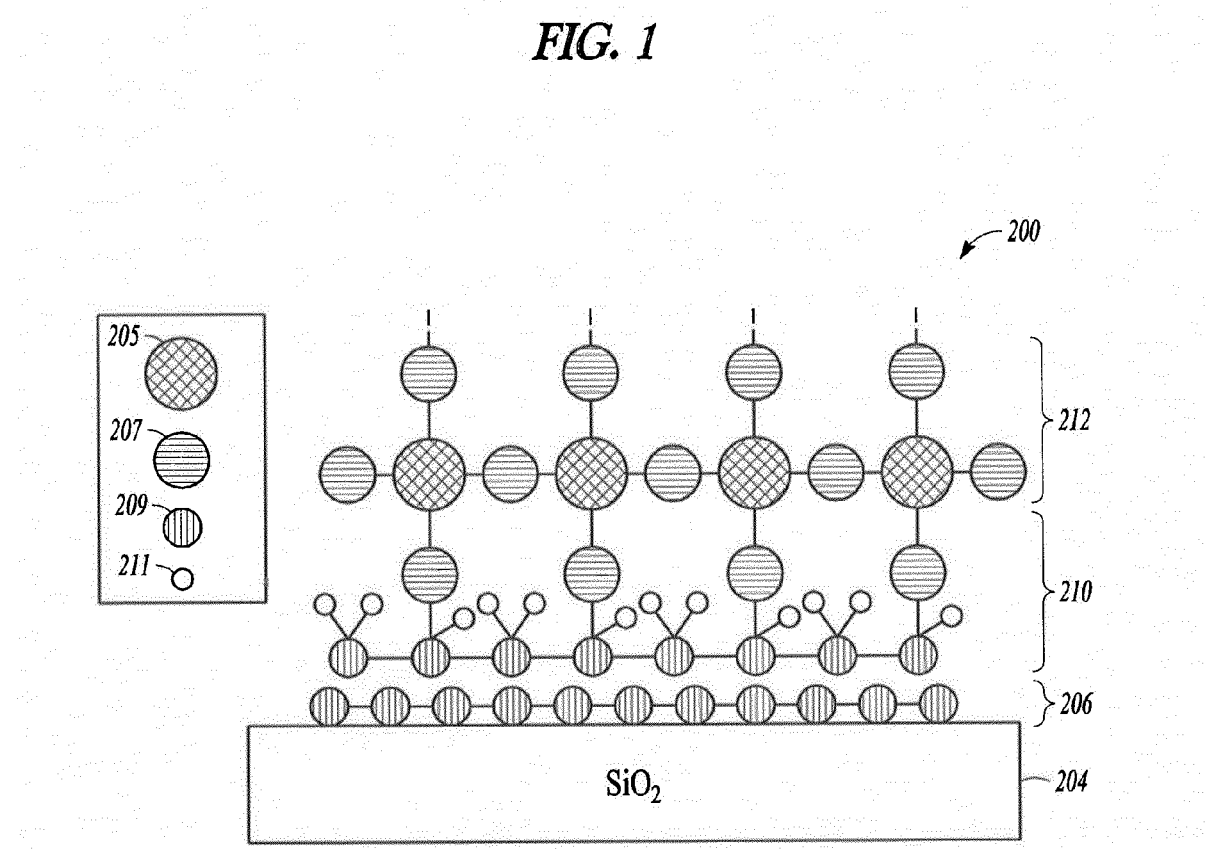
FIG. 2 illustrates generally an example of an apparatus, shown schematically, such as included as a portion of an electronic device.

FIG. 2 illustrates generally an example of an apparatus 200, shown schematically, such as included as a portion of an electronic device. The apparatus 200 can include a graphene layer 206 including one or more carbon atoms 209, a PVA layer 210, and a hafnium oxide layer 212 such as deposited on or otherwise bonded to the PVA layer 210. In an example, such as during fabrication of one or more of the examples of FIG. 1, 4-8, 9A-B, or 10-11, polyvinyl alcohol PVA can be used as an absorption layer. For example, the hydrophobicity of the PVA carbon chain can lead to its adsorption on the graphene surface with hydroxyl groups facing "up," (e.g., the hydroxyl groups including an oxygen atom 207, and a hydrogen atom 211, shown schematically in FIG. 2), such as facilitating ALD growth as shown in FIG. 1. Since PVA has a relatively high dielectric constant (e.g., $\kappa$~6), it can be used as a portion of a dielectric layer, such as for a portion of gate dielectric as shown in the example of FIG. 1, above.

In an example, a single-layer graphene sample can be prepared (e.g., the graphene layer 206), such as by mechanical exfoliation onto a silicon wafer (e.g., a wafer including a silicon dioxide layer 204). In an illustrative example, the wafer including the graphene layer 206, can be dipped into about an 0.5% aqueous solution of about 85,000-125,000 molecular weight PVA (e.g., provided by Sigma-Aldrich Co. or one or more other sources, or including one or more other molecular weight ranges). In an example, one or more other concentrations of PVA can be used (e.g., from about 0.5% to about 2% aqueous PVA can be used, among other ranges).

In an example, the PVA dipped sample can then be rinsed using a second dip, such as into deionized water, and then the sample can be gently blown dry, such as with nitrogen. Such a technique can provide an approximately 2.5 nanometer (nm) thick PVA layer 210. In an example, one or more layers, such as the PVA layer 210, can be spin-coated onto the sample, in addition to or instead of dipping the sample in aqueous PVA. In an example, a brief ultraviolet light treatment (e.g., about 5 minutes in duration) and ozone treatment can be used, such as to one or more of activate the —OH groups on the PVA layer 210 or cross-link the PVA layer 210. In an example, such as after activation of at least a portion of the PVA layer 210, atomic layer deposition (ALD) can be used to provide the hafnium oxide layer, such as including deposition at 150° C. using $[(CH_3)_2N]_4Hf$ and $H_2O$, such as for about 50 cycles. Such ALD of hafnium oxide can provide about a 5 nm-thick hafnium oxide film layer 212. In an example, one or more other materials can be deposited, such as one or more materials that can relay on the —OH groups on the surface of the PVA layer 210, such as using ALD.

Figure 3:
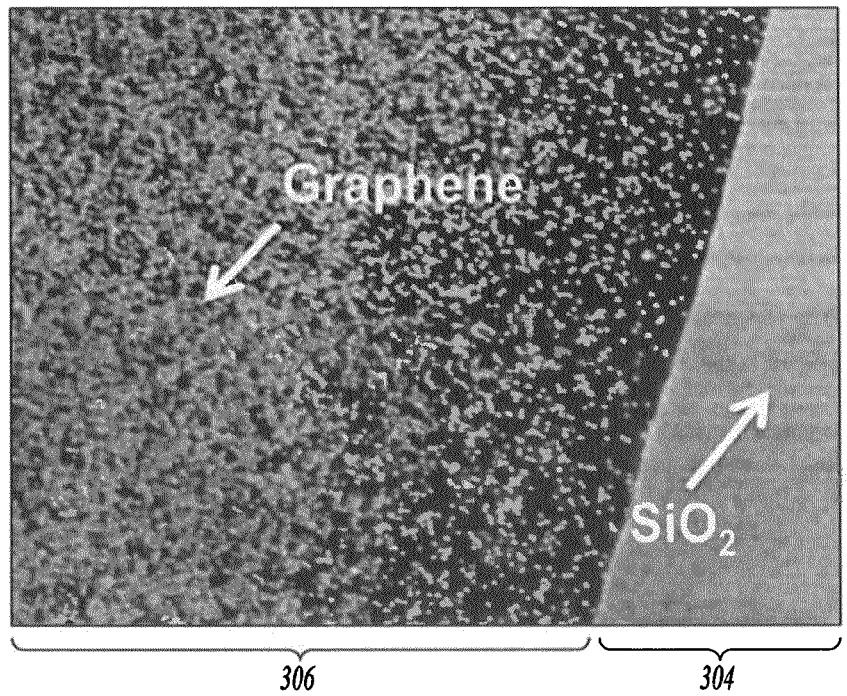
FIG. 3 includes an illustrative example of an image generated using atomic force microscopy (AFM) on a sample that can include a graphene portion and a silicon dioxide portion, the graphene portion without a PVA layer.

FIG. 3 includes an illustrative example of an image generated using atomic force microscopy (AFM) on a sample that can include a graphene portion 306 and a silicon dioxide portion 304, the graphene portion 306 without a PVA layer. The example of FIG. 3 can be similar in preparation and structure to the apparatus of the examples of FIGS. 1-2, except lacking the PVA layer. In FIG. 3, without a PVA layer, ALD growth generally proceeds only on the $SiO_2$ portion 304, leaving only small patches of oxide at nucleation sites formed by surface contamination on the graphene portion 306. Such nucleation sites can result in the stippled appearance of the graphene portion 306 in the AFM image of FIG. 3.

Figure 4:
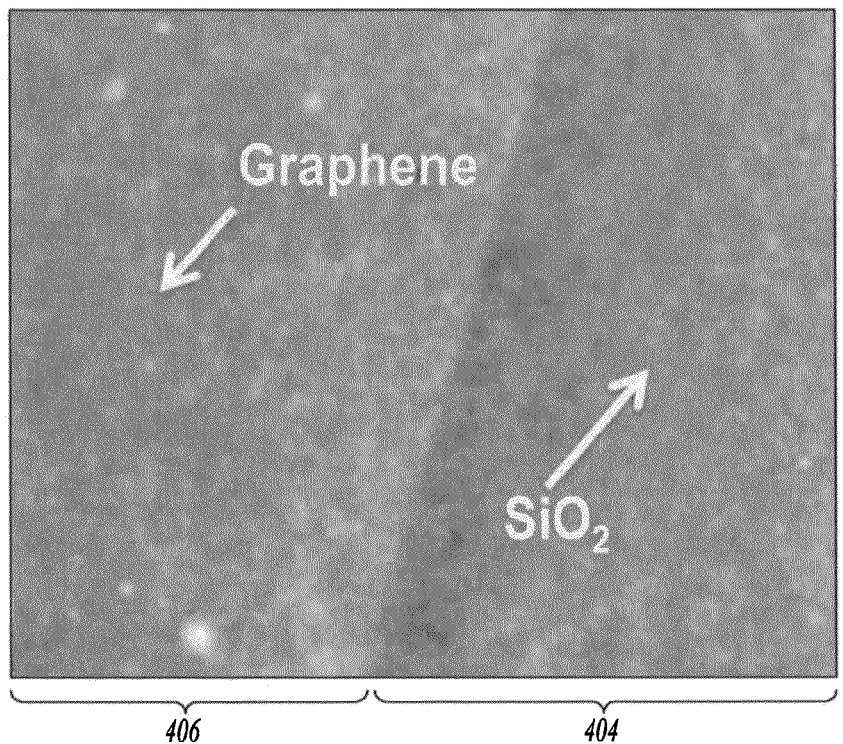
FIG. 4 includes an illustrative example of an image generated using AFM on a sample that can include a graphene portion and a silicon dioxide portion, the graphene portion including a PVA layer, such as prepared and shown in the examples of FIGS. 1-2, and in contrast to FIG. 3.

FIG. 4 includes an illustrative example of an image generated using AFM on a sample that can include a graphene portion 406 and a silicon dioxide portion 404, the graphene portion 406 including a PVA layer, such as prepared and shown in the examples of FIGS. 1-2, and in contrast to FIG. 3. In the example of FIG. 4, the graphene portion can be coated with a PVA layer prior to the deposition of an oxide layer. When the PVA layer is included before oxide deposition, the oxide film can grow more uniformly on the $SiO_2$ portion 404 and the graphene portion 406. Such uniform coverage can provide a surface roughness across both portions 404 and 406 of about ±3 A°, in an illustrative example.

Figure 5:
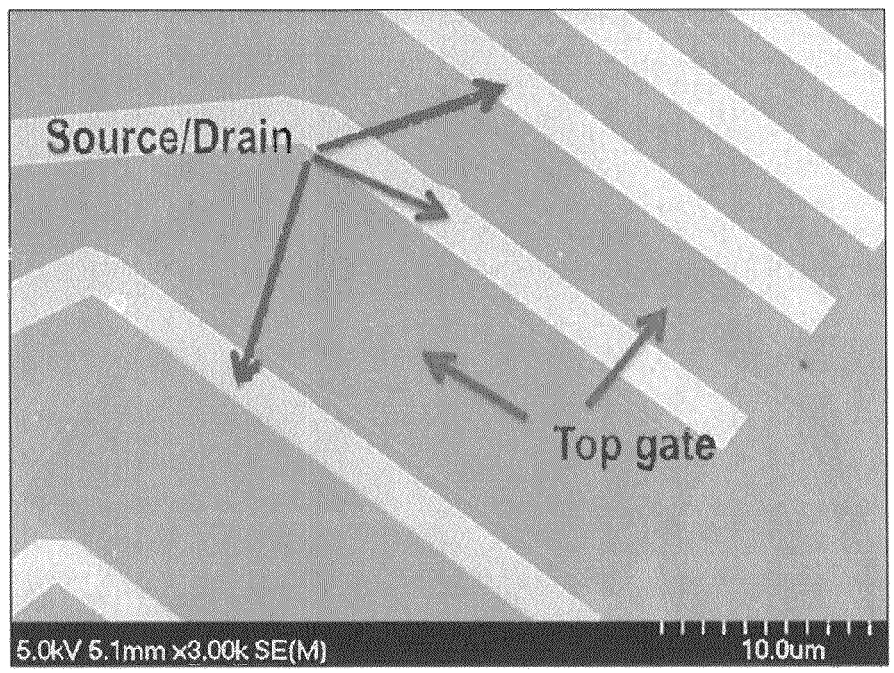
FIG. 5 includes an illustrative example of an image generated using scanning electron microscopy (SEM) on an apparatus (e.g., similar to a portion of the apparatus of FIGS. 1-2) that can include one or more gate, source, or drain electrode portions.

FIG. 5 includes an illustrative example of an image generated using scanning electron microscopy (SEM) on an apparatus (e.g., similar to a portion of the apparatus of FIGS. 1-2) that can include one or more gate, source, or drain electrode portions. The present inventors have also recognized that oxide films can characterized such as by fabricating an electronic device such as shown and prepared similarly to the examples of FIGS. 1-2, such as using or including one or more graphene FETs (GFETs). In an illustrative example, similar to FIG. 1, a graphene film can be prepared, such as by exfoliation of graphene onto about a 285-300 nm-thick $SiO_2$ layer on an 0.01-Ω-cm Si wafer, such as allowing "backgating" through the Si wafer substrate. In the example of FIG. 5, one or more source or drain contacts, such as including Cr/Au, can be e-beam deposited (e.g., providing about 1 nm-thick Cr and about 70-80 nm-thick Au metallization, or one or more other thicknesses). In an example, such as following e-beam deposition (or using one or more other techniques), the source or drain contacts can be exposed to about 350° C. Ar anneal, such as for about 210 minutes, such as to remove contamination that might result from one or more lithographic steps.

After forming one or more source or drain contact, an $HfO_2$ film can be grown, such as using ALD after PVA functionalization, such as to provide a roughly 10-13 nm-thick dielectric film. In an example, a thicker film can be formed to ensure the absence of pin-hole defects at >90% yield, but at the cost of throughput. In an example, such an oxide film as thin as about 7-nm can be fabricated, but with a correspondingly lower yield (e.g., a higher defect rate). After deposition of the film layer, one or more gate contacts can be fabricated (e.g., formed or deposited) upon the dielectric film, such as one or more top gates shown in the example of FIG. 5. As shown in FIG. 5, the source or drain can be assigned somewhat arbitrarily when the devices are laterally-symmetric with respect to the gate. Thus, in the illustrative example of FIG. 5, one or more GFET devices including differing top gate channel lengths can be fabricated, such as including one or more commonly-shared source or drain electrodes.

Figure 6:
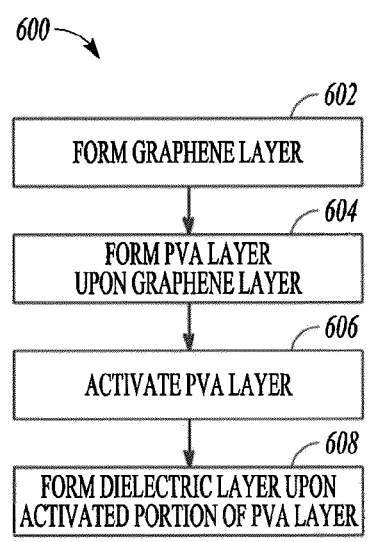
FIG. 6 illustrates generally an example that can include forming a graphene layer, forming a PVA layer upon the graphene layer, and forming a dielectric layer upon the PVA layer FIG. 7 includes plots of measured relationships between back-gate voltage and resistivity corresponding to an illustrative example of an apparatus similar to the example of FIG. 1, but lacking a top-gate electrode.

FIG. 6 illustrates generally an example 600 that can include forming a graphene layer, forming a PVA layer upon the graphene layer, and forming a dielectric layer upon the PVA layer. For example, at 602, the example 600 can include one or more techniques of forming a single-layer graphene layer, such as using exfoliation onto a rigid substrate as discussed above in the examples of FIGS. 1-5. At 604, a PVA layer can formed upon at least a portion of the graphene layer. Such a PVA layer can be used, at least in part, as a dielectric material to isolate a gate electrode from the graphene. Such a PVA layer can also be used to provide a functionalized layer suitable as a substrate for deposition of one or more dielectric layers onto the PVA layer.

For example, at 606, at least a portion of the PVA layer can be activated, such as discussed above in the examples of FIGS. 1-2, and 4. At 608, a dielectric layer can then be formed upon the activated (e.g., functionalized) portion of the PVA layer. Such a dielectric layer can include a hafnium oxide layer deposited using ALD, or one or more other oxide materials deposited or otherwise formed.

Figure 7:
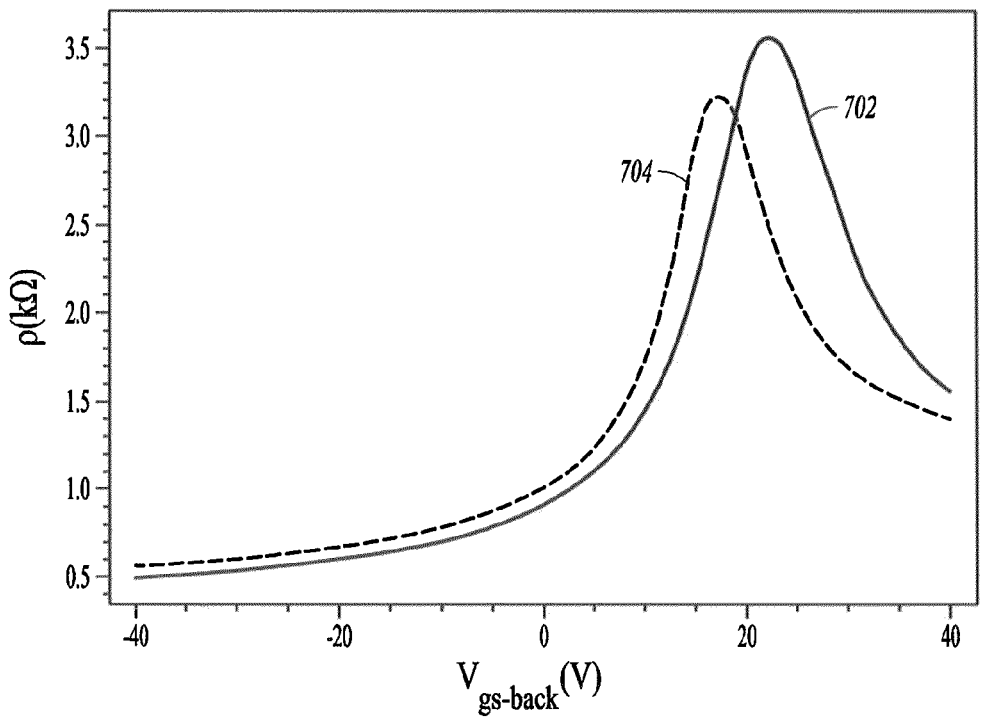

FIG. 7 includes plots of measured relationships between back-gate voltage and resistivity corresponding to an illustrative example of an apparatus similar to the example of FIG. 1, but lacking a top-gate electrode. For example, an apparatus as shown below in the example of FIG. 10 can be measured using a two-probe approach to provide one or more resistivity plots as shown in FIG. 7. In FIG. 7, the resistivity plots correspond to an illustrative example having a PVA layer 704 (e.g., similar to FIG. 4), and an illustrative example without a PVA layer 702 (e.g., similar to FIG. 3). In FIG. 7, the plotted resistivities can be represented by $\rho=1/g_{ds}$ (e.g., an inverse of drain-source conductance), in kiloOhms, and measured as a function of $V_{gs\text{-}back}$. $V_{gs\text{-}back}$ can represent an applied back gate bias voltage, while $V_{ds}$ can represent a drain-to-source voltage that can be around zero volts. The field-effect mobility of an electronic device (e.g, as constructed similarly in FIGS. 1-2) can remain about the same after the PVA functionalization (e.g., as observed consistently over dozens of samples), as compared to a device without the PVA layer, as shown in the resistivity plots of the illustrative examples of FIG. 7.

Figure 8:
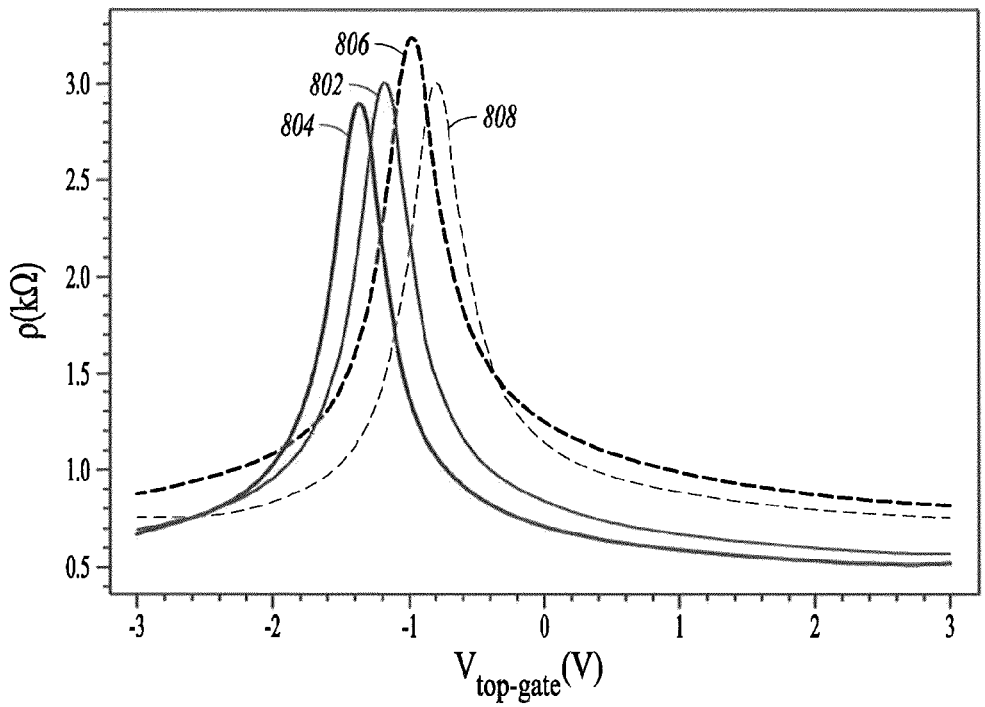
FIG. 8 includes plots of measured relationships between top-gate voltage and resistivity for an illustrative example of an apparatus similar to the example of FIG. 1, with each plot corresponding to a specified back gate biasing condition.

FIG. 8 includes plots of measured relationships between top-gate voltage and resistivity for an illustrative example of an apparatus similar to the example of FIG. 1, with each plot corresponding to a specified back gate biasing condition.

In an example, similar to the examples of FIGS. 1-2, 4, and 5, a roughly 40-nm-thick top-gate metal can be patterned onto the dielectric layer (e.g., upon a hafnium oxide layer). In the illustrative examples of FIG. 8, similar to the examples of FIG. 7, a resistivity can be represented by ρ, and can be measured using a two-probe approach and plotted as a function of $V_{gs\text{-}top}$, the top-gate bias. Each plot included in FIG. 8 can correspond to a specified value of $V_{gs\text{-}back}$. In FIG. 8, a first resistivity 802 can represent a $V_{gs\text{-}back}$ of around 0 volts, with $V_{gs\text{-}top}$ swept from around −3 volts to around +3 volts. A second resistivity 804 can represent a $V_{gs\text{-}back}$ of around +15 volts, with $V_{gs\text{-}top}$ similarly swept from around −3 volts to around +3 volts. A third resistivity 806 can represent a $V_{gs\text{-}back}$ of around −15 volts, with $V_{gs\text{-}top}$ similarly swept from around −3 volts to around +3 volts. A fourth resistivity 808 can represent 808 can represent a $V_{gs\text{-}back}$ of around −30 volts, with $V_{gs\text{-}top}$ similarly swept from around −3 volts to around +3 volts.

In the illustrative example of FIG. 8, a Dirac point at different values of $V_{gs\text{-}back}$ can be determined, and can indicate a ratio of top-gate to back-gate capacitances of about $C_{gs\text{-}top}/C_{gs\text{-}back}\sim50$. Such a ratio can indicate a top-gate capacitance per unit area of about 600 nanoFarads/centimeter$^2$ (nF/cm$^2$) such as including an effect of a quantum capacitance of the graphene layer. Such a capacitance per unit area can be almost twice the magnitude of a capacitance per unit area provided using other approaches involving other dielectric films (e.g., such other approaches including a dielectric film deposition or evaporation process lacking a PVA layer or other functionalization of the graphene). Also, the $HfO_2$ dielectric film, such as included the examples of FIGS. 1-2, 4, 6, and 8, can have a break down voltage of about 6 megavolts/centimeter or more.

Figure 9A:
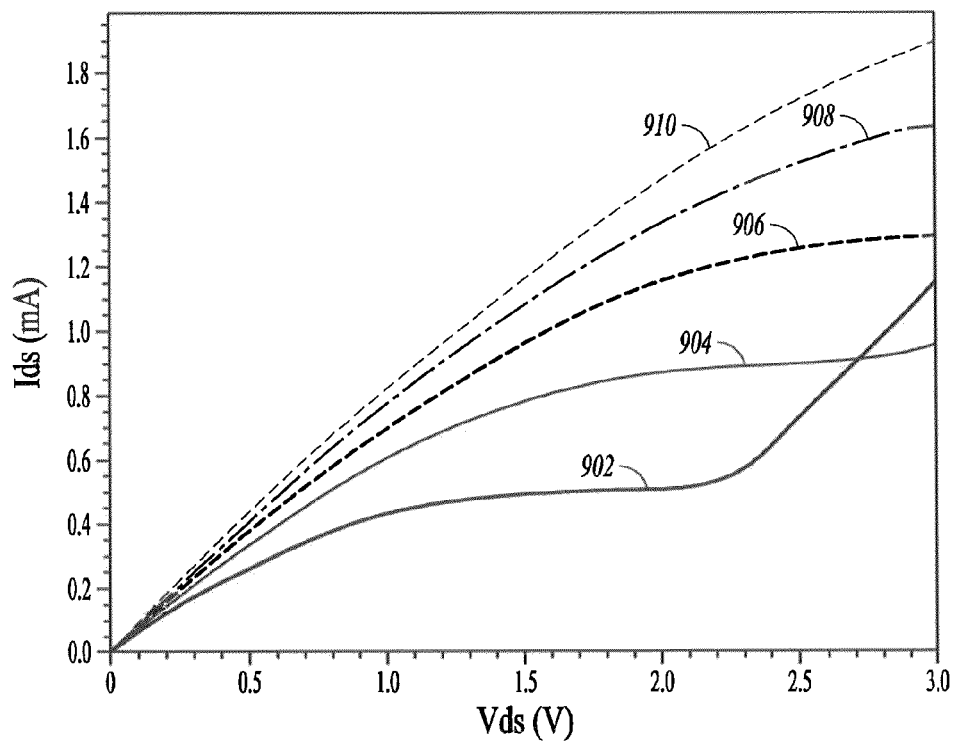
FIGS. 9A-B include plots of measured current-voltage ("I-V") relationships for an illustrative example of an apparatus similar to the examples of FIG. 1, 2, 4, or 5, such as plotted in milliamps flowing from the drain to the source versus a voltage across the drain-source electrode combination, using various specified gate biasing conditions.
Figure 9B:
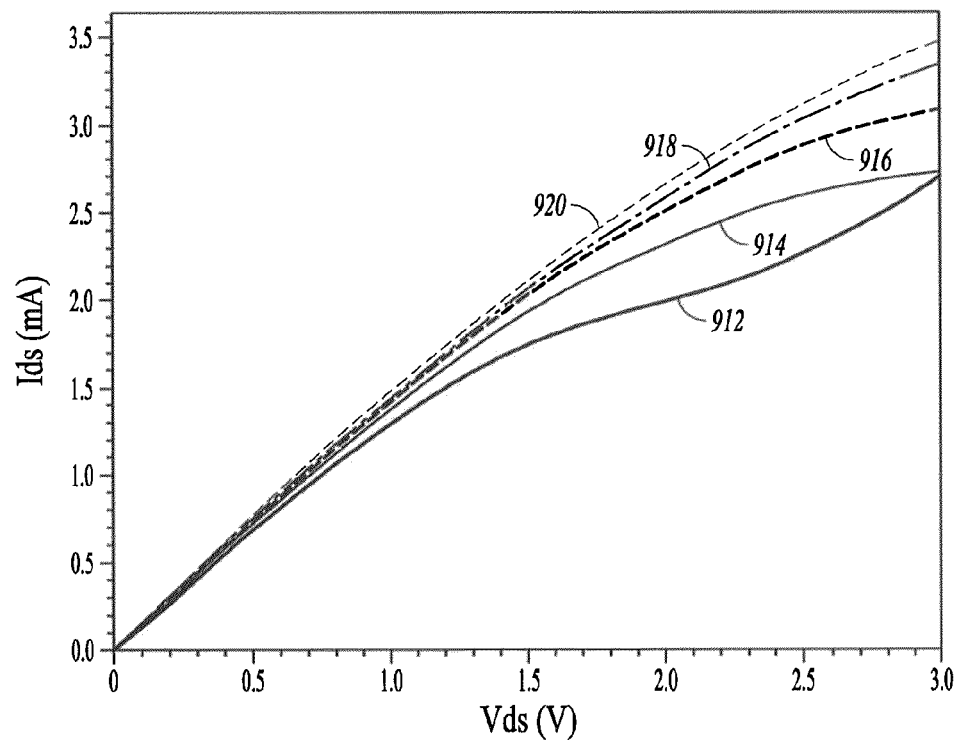

FIGS. 9A-B include plots of measured current-voltage ("I-V") relationships for an illustrative example of an apparatus similar to the examples of FIG. 1, 2, 4, or 5, such as plotted in milliamps flowing from the drain to the source versus a voltage across the drain-source electrode combination, using various specified gate biasing conditions.

In the examples of FIGS. 9A-B, the SEM image of the example of FIG. 5 can be characterized such as using a high-bias transistor characterization technique, such as corresponding to an illustrative example of a GFET having an 8-micrometer(μm) channel length in FIG. 9A, and a GFET having a 1-μm channel length in FIG. 9B. In the examples of both FIGS. 9A and 9B, a saturation behavior and a "kink" characteristic of the transition to an ambipolar channel can be observed.

In FIG. 9A, a first I-V plot 902 includes a −1.5V top-gate voltage, and a 0V back-gate voltage, a second I-V plot 904 includes a −1.0V top-gate voltage, and a 0V back-gate voltage, a third I-V plot 906 includes a −0.5V top-gate voltage, and a 0V back-gate voltage, a fourth I-V plot 908 includes a 0V top-gate voltage, and a 0V back-gate voltage, and a fifth I-V plot 910 includes a +0.5V top-gate voltage, and a 0V back-gate voltage.

In FIG. 9B, a sixth I-V plot 912 includes a −1.5V top-gate voltage, and a 0V back-gate voltage, a seventh I-V plot 914 includes a −1.0V top-gate voltage, and a 0V back-gate voltage, a eighth I-V plot 916 includes a −0.5V top-gate voltage, and a 0V back-gate voltage, a ninth I-V plot 918 includes a 0V top-gate voltage, and a 0V back-gate voltage, and a tenth I-V plot 920 includes a +0.5V top-gate voltage, and a 0V back-gate voltage.

Figure 10:
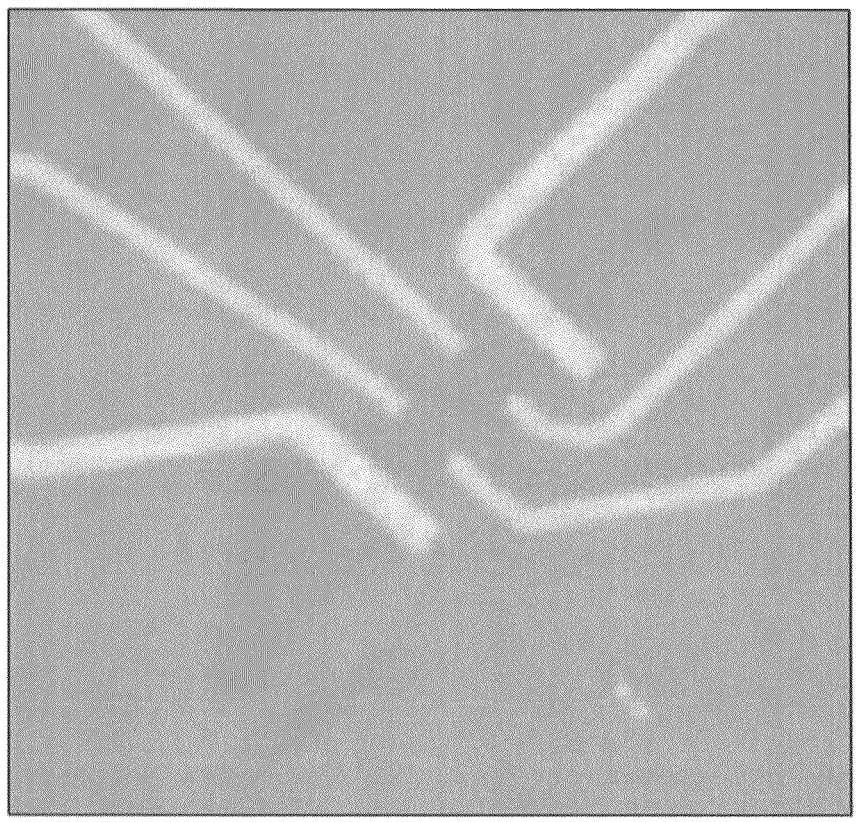
FIG. 10 includes a photo of an illustrative example of an apparatus that can include a graphene layer, a PVA layer, and a dielectric layer, similarly prepared or configured as in the examples of FIG. 1-2, or 4-5, but including a four-probe electrode configuration.

FIG. 10 includes a photo of an illustrative example of an apparatus that can include a graphene layer, a PVA layer, and a dielectric layer, similarly prepared or configured as in the examples of FIG. 1-2, or 4-5, but including a four-probe configuration. To further understand SPOP effects on transport in the graphene channel, a temperature dependence of the triode region resistivity of the graphene channel (around zero $V_{ds}$) can be measured, as shown in the illustrative example of FIG. 11, such as using the apparatus of the illustrative example of FIG. 10.

Figure 11:
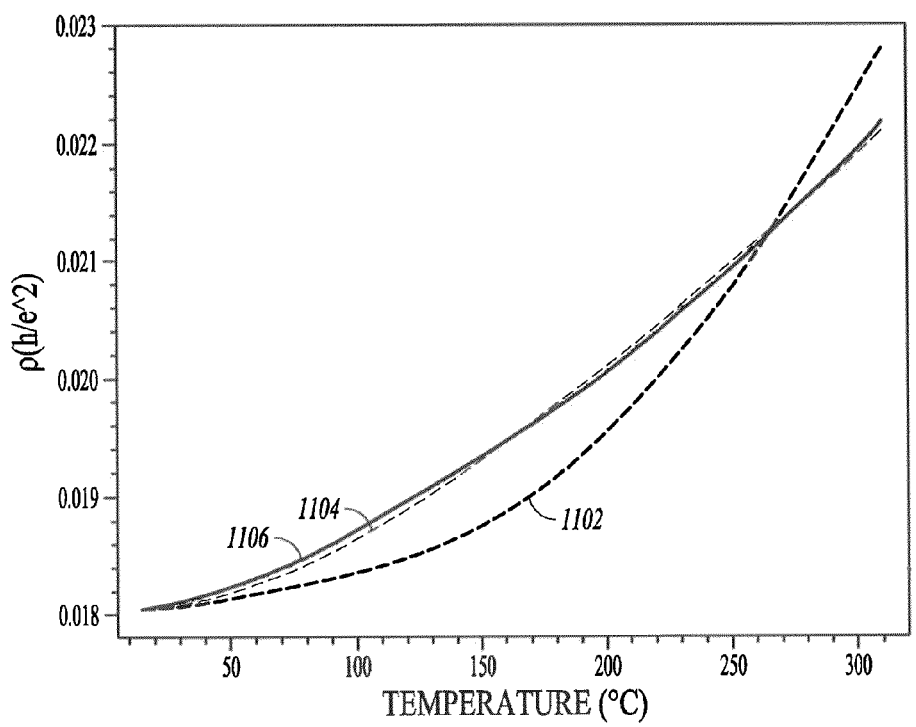
FIG. 11 includes plots of predicted and measured relationships between resistivity and temperature for an illustrative example of an apparatus such as shown in the example of FIG. 10.

FIG. 11 includes plots of predicted and measured relationships between resistivity and temperature for an illustrative example of an apparatus such as shown in the example of FIG. 10. A resistivity provided by an electronic device, such as a GFET, can vary as a function of temperature. In the illustrative example of FIG. 10, a four-probe GFET structure can be fabricated, and a resistivity can be measured such as using $V_{gs\text{-}back} = -50V$, such as yielding a roughly $3.75 \times 10^{12}$-$cm^{-2}$ hole channel. Such a temperature-dependent resistivity can be represented (e.g., fit or modeled), such as by $\rho(T) = \rho_0 + \rho_A(T) + \rho_{RPS}(T)$, where $\rho_0$ can represent a zero-temperature-limit component, $\rho_A$ can represent a component associated with acoustic phonon scattering, and $\rho_{RPS}$ can represent a component due to remote phonon scattering. A first plot 1102 shows a relatively poor data fit (e.g., model) that can result when only the two lowest $SiO_2$ surface phonon modes are considered (59 meV and 155 meV). A second plot 1104 can include a fit (e.g., model) in which $HfO_2$ modes (e.g., at 21 meV and 55 meV) can be taken into account. The second plot 1104 can represent a significant improvement, such as more closely modeling a measured resistivity, such as shown in the illustrative example of a third plot 1106. The examples of FIG. 11 can suggest that the inclusion of the PVA layer may have a minimal effect on the coupling of the surface polar optical phonons of $HfO_2$. In an example, to achieve higher performance, GFETs can include additional engineering of surface dielectrics, such as to reduce or minimize the effects of remote phonon coupling.

The above description has particularly emphasized examples in which PVA is used to functionalize graphene for forming a dielectric thereupon, such as for use in a graphene field-effect or other transistor, capacitor, or other graphene-based electronic device. However, the present inventors have also recognized that such techniques can also be applied to a carbon nanotube or like graphene nanostructure. This can be used to form an electronic device, in an illustrative example.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Descrip- The claimed invention is:

1. A method, comprising:
   forming a graphene layer defining a working surface;
   forming a polyvinyl alcohol (PVA) layer upon the working surface of the grapheme layer;
   activating the PVA layer to provide a functionalized portion of the PVA layer;
   forming a dielectric layer upon the functionalized portion of the PVA layer;
   forming a first electrode located upon and conductively coupled to the working surface of the graphene layer; and
   forming a second electrode located upon and conductively coupled to the working surface of the graphene layer, the second electrode formed at a location laterally separated from the first electrode along the working surface of the graphene layer;
   wherein at least a portion of the PVA layer is located upon the working surface of the graphene layer between the first and second electrodes.

2. The method of claim 1, wherein the dielectric layer comprises hafnium oxide.

3. The method of claim 1, wherein forming the PVA layer upon the graphene includes treating the graphene layer with an aqueous solution including PVA.

4. The method of claim 1, wherein activating the PVA layer includes exposing the PVA layer to ultraviolet light.

5. The method of claim 1, wherein activating the PVA layer includes treating the PVA layer with ozone.

6. The method of claim 1, wherein forming the dielectric layer includes depositing the dielectric layer using atomic layer deposition (ALD).

7. The method of claim 1, wherein the dielectric layer is formed upon the first and second electrodes and is formed laterally between the first and second electrodes upon the functionalized portion of the PVA layer.

8. The method of claim 7, comprising forming a third electrode upon the dielectric layer in the lateral region between the first and second electrodes.

9. The method of claim 8, comprising:
   forming an oxide layer upon a conductive substrate;
   wherein the graphene layer is formed upon the oxide layer.

10. The method of claim 9, wherein the conductive substrate comprises silicon.

11. The method of claim 9, wherein at least a portion of the graphene layer, at least a portion of the PVA layer, at least a portion of the dielectric layer, and at least a portion of the respective first, second, and third electrodes are formed to establish a field-effect transistor;
   wherein the first and second electrodes are formed to establish a respective source electrode and a respective drain electrode of the field-effect transistor;
   wherein the third electrode is formed to provide a top-gate electrode;
   wherein the conductive substrate is formed to provide a bottom-gate electrode; and
   wherein a channel length of the transistor is determined at least part by a lateral width of the third electrode between the first and second electrodes.

12. The method of claim 8, wherein at least a portion of the graphene layer, at least a portion of the PVA layer, at least a portion of the dielectric layer, and at least a portion of the respective first, second, and third electrodes are formed to establish a field-effect transistor;
   wherein the first and second electrodes are formed to establish respective source electrode and a respective drain electrode of the field-effect transistor;
   wherein the third electrode is formed to provide a top-gate electrode; and
   wherein a channel length of the transistor is determined at least part by a lateral width of the third electrode between the first and second electrodes.

13. The method of claim 1, comprising:
   forming an oxide layer upon a conductive substrate;
   wherein the graphene layer is formed upon the oxide layer;
   wherein at least a portion of the graphene layer, at least a portion of the PVA layer, at least a portion of the dielectric layer, and at least a portion of the respective first and second electrodes are formed to establish a field-effect transistor;
   wherein the first and second electrodes are formed to establish respective source electrode and a respective drain electrode of the field-effect transistor; and
   wherein the conductive substrate is formed to provide a bottom-gate electrode.

14. A method, comprising:
   forming an oxide layer upon a conductive substrate;
   forming a graphene layer upon the oxide layer, the graphene layer defining a working surface;
   forming a polyvinyl alcohol (PVA) layer upon the working surface of the grapheme layer;
   activating the PVA layer to provide a functionalized portion of the PVA layer;
   depositing a dielectric layer upon the functionalized portion of the PVA layer using atomic layer deposition (ALD);
   forming a first electrode located upon and conductively coupled to the working surface of the graphene layer; and
   forming a second electrode located upon and conductive coupled to the working surface of the graphene layer, the second electrode formed at a location laterally separated from the first electrode along the working surface of the graphene layer.

15. The method of claim 14, wherein the dielectric layer is formed upon the first and second electrodes and is formed laterally between the first and second electrodes upon the functionalized portion of the PVA layer.

16. The method of claim 14, wherein the dielectric layer comprises hafnium oxide.

17. The method of claim 14, comprising forming a third electrode upon the dielectric layer in the lateral region between the first and second electrodes.

18. The method of claim 17, wherein at least a portion of the graphene layer, at least a portion of the PVA layer, at least a portion of the dielectric layer, and at least a portion of the respective first, second, and third electrodes are formed to establish a field-effect transistor;
   wherein the first and second electrodes are formed to establish respective source electrode and a respective drain electrode of the field-effect transistor;
   wherein the third electrode is formed to provide a top-gate electrode; and
   wherein a channel length of the transistor is determined at least part by a lateral width of the third electrode between the first and second electrodes.

19. A method, comprising:
   forming an oxide layer upon a conductive substrate;
   forming a graphene layer upon the oxide layer, the graphene layer defining a working surface;
   forming a polyvinyl alcohol (PVA) layer upon the working surface of the grapheme layer;
   activating the PVA layer to provide a functionalized portion of the PVA layer;
   depositing a dielectric layer comprising hafnium oxide upon the functionalized portion of the PVA layer using atomic layer deposition (ALD);
   forming a first electrode located upon and conductively coupled to the working surface of the graphene layer; and
   forming a second electrode located upon and conductive coupled to the working surface of the graphene layer, the second electrode formed at a location laterally separated from the first electrode along the working surface of the graphene layer.

20. The method of claim 19, wherein at least a portion of the PVA layer is located upon the working surface of the graphene layer between the first and second electrodes; and
   wherein the dielectric layer is formed upon the first and second electrodes and is formed laterally between the first and second electrodes upon the functionalized portion of the PVA layer.

* * * * *